(12) United States Patent
Yang et al.

(10) Patent No.: US 11,081,536 B1
(45) Date of Patent: Aug. 3, 2021

(54) DISPLAY DEVICE

(71) Applicant: Wuhan China Star Optoelectronics Semiconductor Display Technology Co., Ltd., Wuhan (CN)

(72) Inventors: Hanning Yang, Wuhan (CN); Lei Hu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 109 days.

(21) Appl. No.: 16/625,720

(22) PCT Filed: Nov. 5, 2019

(86) PCT No.: PCT/CN2019/115543
§ 371 (c)(1),
(2) Date: Dec. 22, 2019

(87) PCT Pub. No.: WO2021/035948
PCT Pub. Date: Mar. 4, 2021

(30) Foreign Application Priority Data

Aug. 23, 2019 (CN) .......................... 201910782408.1

(51) Int. Cl.
*H01L 27/32* (2006.01)
*H01L 51/52* (2006.01)

(52) U.S. Cl.
CPC ...... *H01L 27/3244* (2013.01); *H01L 27/3234* (2013.01); *H01L 51/5293* (2013.01)

(58) Field of Classification Search
CPC ... H01L 27/3234–3244; H01L 51/5293; G02F 1/133509
See application file for complete search history.

(56) References Cited

U.S. PATENT DOCUMENTS

2014/0265822 A1* 9/2014 Drzaic ................ H01L 51/5284
313/504
2020/0328373 A1* 10/2020 Huang .................. H01L 27/323

* cited by examiner

*Primary Examiner* — Alia Sabur

(57) ABSTRACT

A display device includes a thin film transistor (TFT) array substrate, an organic light-emitting diode (OLED) display layer, a polarizer, a protective cover, and a camera module. The polarizer is provided with a through hole, and the camera module is disposed corresponding to the through hole, wherein an ink layer is disposed on the protective cover plate and completely overlaps with the through hole are completely overlapped, and the ink layer transmits only red, green, and blue lights. By polarizer in the area corresponding to the screen camera, and replacing the removed polarizer with a black ink, the camera under a screen can image in high definition, thus being conducive to the development of a full screen.

18 Claims, 4 Drawing Sheets

DISPLAY DEVICE

RELATED APPLICATIONS

This application is a National Phase of PCT Patent Application No. PCT/CN2019/115543 having International filing date of Nov. 5, 2019, which claims the benefit of priority of Chinese Patent Application No. 201910782408.1 filed on Aug. 23, 2019. The contents of the above applications are all incorporated by reference as if fully set forth herein in their entirety.

FIELD AND BACKGROUND OF THE INVENTION

The present invention relates to a field of display technologies, and in particular, to a display device.

With the development of technology and people's requirements for all aspects of product performance, a full screen has become a highly anticipated technology for smartphones. In order to achieve an ultra-high screen-to-body ratio, a front camera needs to be placed under the display screen. At present, the front camera is generally installed by punching, but the full screen technology with higher screen-to-body ratio cannot be realized. When the front camera is placed under the display screen, the camera under the display screen cannot image clearly due to a low transmittance of the display screen to visible light. At present, a polarizer for an organic light-emitting diode (OLED) usually has a transmittance of 40%-50%, thus being one of the important factors for reducing the transmittance of the screen, which causes the front camera not getting a clear image, limiting applications of the camera under the screen.

SUMMARY OF THE INVENTION

The present invention provides a display device for solving the technical problem in prior art display device that the camera under the display screen cannot image clearly because the polarizer may reduce transmittance of the screen, thereby impacting the display.

In order to solve the above problem, the technical solution provided by the present invention is as follows:

The present invention provides a display device, including a thin film transistor (TFT) array substrate; an organic light-emitting diode (OLED) display layer disposed on the TFT array substrate; a polarizer disposed on the OLED display layer, wherein the polarizer is provided with a through hole; a protective cover plate disposed on the polarizer; and a camera module disposed on a side of the TFT array substrate facing away from the OLED display layer, and disposed corresponding to the through hole in a thickness direction of the TFT array substrate; wherein an ink layer is disposed on a side of the protective cover plate adjacent to the OLED display layer; an orthographic projection of the ink layer on the TFT array substrate coincides with an orthographic projection of the through hole on the TFT array substrate; the ink layer transmits only red, green, and blue lights; the ink layer has a thickness of 10 micrometers to 100 micrometers; and the ink layer has a transmission width ranging from 3 to 50 nm for each of red, green and blue light wavelengths.

In at least one embodiment of the present invention, the display device further includes an adhesive layer attached to the protective cover plate and the polarizer.

In at least one embodiment of the present invention, the ink layer is disposed on a side surface of the protective cover plate adjacent to the OLED display layer.

In at least one embodiment of the present invention, the through hole is fully filled with the adhesive layer.

In at least one embodiment of the present invention, the adhesive layer is provided between the ink layer and the polarizer.

In at least one embodiment of the present invention, the adhesive layer has a thickness of 50 to 200 μm.

In at least one embodiment of the present invention, an orthographic projection of the camera module on the TFT array substrate is within an orthographic projection of the ink layer on the TFT array substrate.

In at least one embodiment of the present invention, the ink layer is a black ink layer.

The present invention provides another display device, including a thin film transistor (TFT) array substrate; an organic light-emitting diode (OLED) display layer disposed on the TFT array substrate; a polarizer disposed on the OLED display layer, wherein the polarizer is provided with a through hole; a protective cover plate disposed on the polarizer; and a camera module disposed on a side of the TFT array substrate facing away from the OLED display layer, and disposed corresponding to the through hole in a thickness direction of the TFT array substrate; wherein an ink layer is disposed on a side of the protective cover plate adjacent to the OLED display layer, an orthographic projection of the ink layer on the TFT array substrate coincides with an orthographic projection of the through hole on the TFT array substrate, and the ink layer transmits only red, green, and blue lights.

In at least one embodiment of the present invention, the display device further includes an adhesive layer attached to the protective cover plate and the polarizer.

In at least one embodiment of the present invention, the ink layer is disposed on a side surface of the protective cover plate adjacent to the OLED display layer.

In at least one embodiment of the present invention, the through hole is fully filled with the adhesive layer.

In at least one embodiment of the present invention, the adhesive layer is disposed between the ink layer and the polarizer.

In at least one embodiment of the present invention, the adhesive layer has a thickness of 50 to 200 μm.

In at least one embodiment of the present invention, an orthographic projection of the camera module on the TFT array substrate is within an orthographic projection of the ink layer on the TFT array substrate.

In at least one embodiment of the present invention, the ink layer has a thickness of 10 to 100 μm.

In at least one embodiment of the present invention, the ink layer is a black ink layer.

In at least one embodiment of the present invention, the ink layer has a transmission width ranging from 3 to 50 nm for each of red, green and blue light wavelengths.

The present invention has the beneficial effects that the transmittance of the display device can be improved by removing the polarizer in the area corresponding to the screen camera, and replacing the removed polarizer with a black ink that allows light of a specific wavelength to pass through, thereby enabling the camera to image in high definition, thus being conducive to the development of a full screen.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DESCRIPTION OF SPECIFIC EMBODIMENTS OF THE INVENTION

An object of the present invention is to solve the defect of the conventional display device in which the camera under the display screen cannot image clearly because the polarizer may reduce transmittance of a screen, thereby impacting the display.

Figure 1:
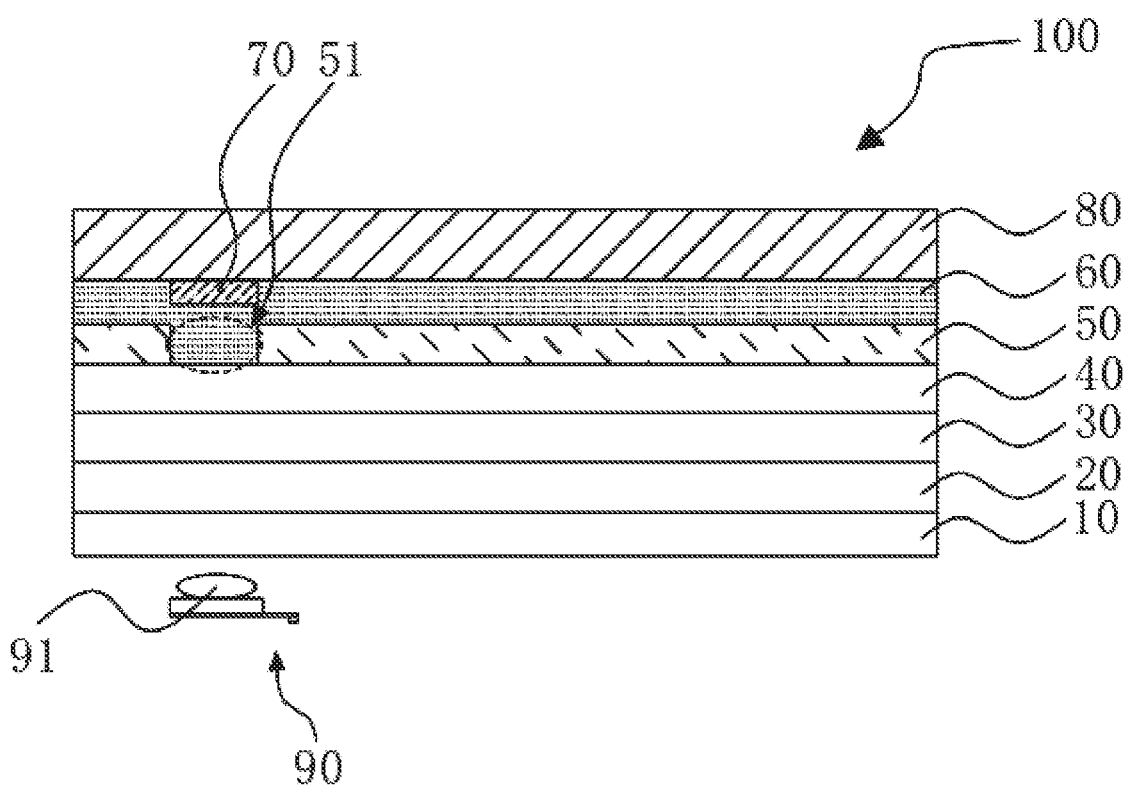
FIG. 1 is a schematic structural diagram of a display device according to an embodiment of the present invention.

As shown in FIG. 1, this embodiment provides a display device 100 including a thin film transistor (TFT) array substrate 20, an organic light-emitting diode (OLED) display layer 30, a polarizer 50, an ink layer 70, a protective cover plate 80, and camera module 90.

The OLED display layer 30 is disposed on the TFT array substrate 20, and the polarizer 50 is disposed on a light-exiting side of the OLED display layer 30. In this embodiment, the polarizer 50 is disposed on the OLED display layer 30, and the camera module 90 is disposed on a side of the TFT array substrate 20 facing away from the OLED display layer 30, that is, the camera module 90 is disposed under the TFT array substrate 20 for implementing the under-screen camera technology, thereby increasing the screen-to-body ratio of the display screen.

Figure 2:
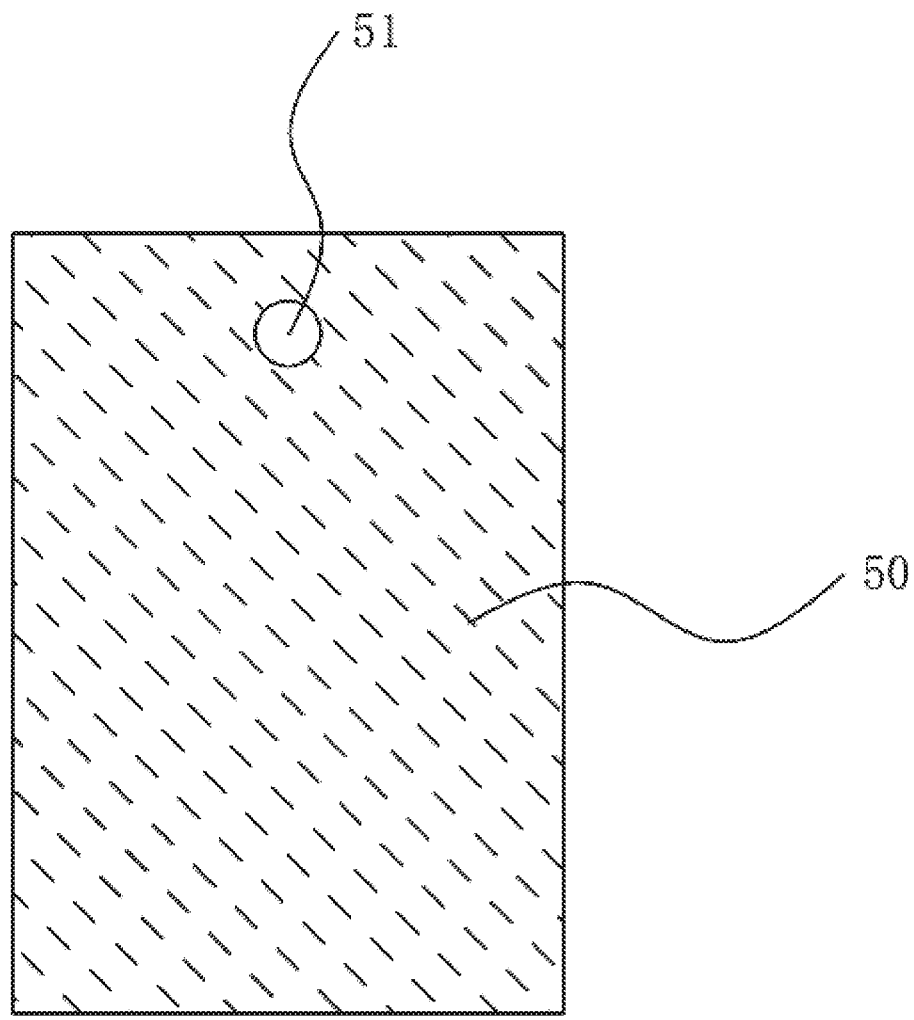
FIG. 2 is a schematic structural diagram of a polarizer according to an embodiment of the present invention.

Since the transmittance of the polarizer 50 is poor, the transmittance of the display screen is impacted, and the camera 91 disposed in the camera module 90 under the TFT array substrate 20 cannot image clearly, which limits applications of the camera under the screen. This embodiment of the present invention is directed to address the above issue. As shown in FIG. 2, a portion of the polarizer 50 corresponding to the camera 91 is bored to form a through hole 51, and the ink layer 70 which only allows red, green and blue light to pass through is disposed directly above the through hole 51. The ink layer 70 can absorb all the light except the red, green and blue light, and not only can act as a substitute for the polarizer, but also can prevent the transmittance of the display screen from being impacted, thereby ensuring that the camera can image clearly.

Specifically, the camera module 90 and the through hole 51 are disposed correspondingly to each other in a thickness direction of the TFT array substrate 20, and an orthographic projection of the ink layer 70 on the TFT array substrate 20 coincides with an orthographic projection of the through hole 51 on the TFT array substrate 20, that is, the ink layer 70 and the through holes 51 are completely overlapped.

Since the protective cover plate 80 functions to protect the internal components of the display device, the protective cover plate 80 is disposed on the polarizer 50. Since the above two are independent structures, the display device should also include an adhesive layer 60 configured to bond the protective cover plate 80 and the polarizer 50, that is, the adhesive layer 60 is disposed between the protective cover plate 80 and the polarizer 50.

The ink layer 70 is disposed on a side of the protective cover plate 80 adjacent to the OLED display layer 30. The ink layer 70 needs to be prepared on a surface of a substrate due to its fluidity, and the through hole 51 is located at the portion corresponding to of the polarizer 50 and the ink layer 70, so that it is difficult to prepare the ink layer 70 on the surface of the polarizer 50, and thus it is preferable to prepare the ink layer 70 on the protective cover plate 80.

Specifically, an ink is applied to a surface of the protective cover plate 80 corresponding to the through hole 51 to form the ink layer 70, then the adhesive layer 60 is formed on a side surface of the protective cover plate 80 formed with the ink layer 70, and then the ink layer 70 is attached to the polarizer 50 by the adhesive layer 60.

In this embodiment, the adhesive layer 60 is an optically clear adhesive (OCA). Since the ink layer 70 is prepared on the surface of the protective cover plate 80, the ink layer 70 is equivalent to a layer of a protrusion that causes the OCA to be filled into a region where the through hole 51 of the polarizer 50 is located when the protective cover plate 80 and the polarizer 50 are attached by the OCA, Therefore, the OCA should have a thickness at least equivalent to a thickness of the polarizer to ensure that the through hole 51 can be fully filled with the adhesive layer 60. The thickness of the adhesive layer ranges from 50 to 200 microns.

In order to enable the camera 91 to image clearly, occlusion of light should be prevented. Therefore, an orthographic projection of the camera 91 on the TFT array substrate 20 needs to fall within an orthographic projection of the ink layer 70 on the TFT array substrate, so that the camera 91 is allowed to obtain enough light.

The camera module 90 mainly filters an object to be measured by red, green and blue pixel points above a sensor, to finally obtain a color image, and the red, green and blue pixel points above the sensor have high transmittance only to red, green and blue light of specific wavelengths. As such, as long as the display screen has high transmittance to the light of the three wavebands, the camera under the display screen can image clearly. The ink layer 70 in this embodiment of the present invention is a black ink layer. When the black ink has high transmittance to monochromatic light in the red, green and blue wavebands and has strong absorption to light in other visible light bands, its color is still black.

Further, sharpening of the color of the display screen pixel is achieved by adjusting the transmission width of the black ink for each wavelength, and therefore, the ink layer is set to have a transmission width ranging from 3 to 50 nm for each of red, green and blue light wavelengths.

Since the ink layer 70 needs to ensure high transmission to red, green, and blue light, the thickness of the ink layer 70 is not excessively thick, which is controlled within a range of 10 to 100 micrometers, and during preparation, the ink layer 70 having the same size as that of the camera 91 is ensured.

Figure 3:
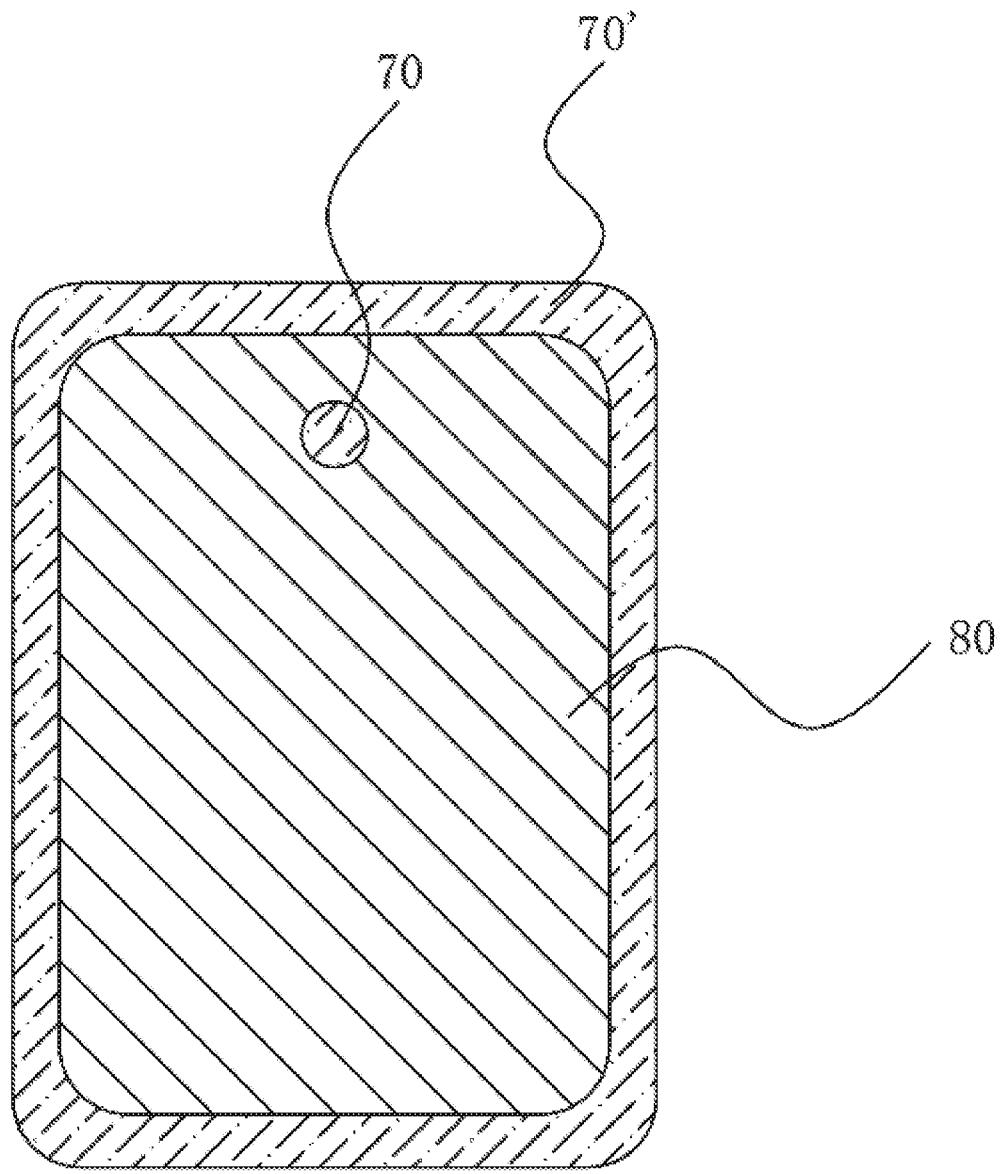
FIG. 3 is a schematic structural diagram of an ink layer according to an embodiment of the present invention.

As shown in FIG. 3, since a non-display area of the display screen needs to be shielded from light, another black ink that completely shields light may be used for the light-shielding. Therefore, when a light-shielding layer 70' is formed around the display screen, the ink layer 70 and the light shielding layer 70' both can be completed in a same coating process.

When receiving wavelengths of the R/G/B pixels of the camera 91 is the same as emission wavelengths of the R/G/B pixel of the display screen, the ink layer only needs to have high transmittance to the three kinds of light wavelengths corresponding to the above R/G/B pixels. When the receiving wavelengths of the R/G/B pixels of the camera 91 are different from the emission wavelengths of the R/G/B pixels of the display screen, the ink layer only needs to have high transmittance to the six kinds of light wavelengths corresponding to the above R/G/B pixels.

When external light passes through the ink layer 70 under the protective cover plate 80, only light of a specific wavelength is transmitted and irradiated into the camera 91 under the screen, and other light that cannot impact the imaging of the camera is absorbed by the ink layer 70. When the display screen emits light, only light of a specific wavelength can be transmitted through the black ink layer 70 to outside to form a display image, so that sharpening of the color of the display screen pixel is achieved by adjusting the transmission width of the black ink for each wavelength.

The TFT array substrate 20 includes a base substrate and a TFT device disposed on the base substrate, a side of the flexible substrate facing away from the TFT device is further provided with a protective layer 10 for protecting the TFT module on the base substrate, and the camera module 90 is disposed under the protective layer 10.

Figure 4:
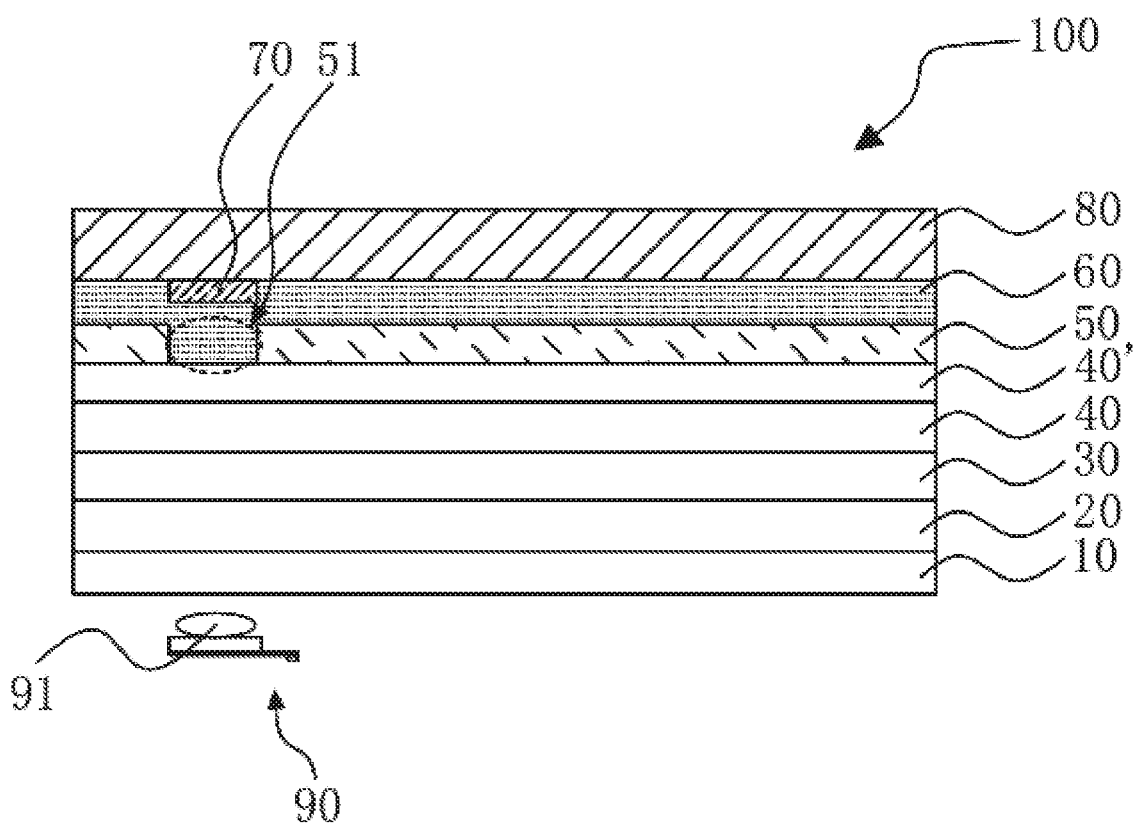
FIG. 4 is a schematic structural diagram of a display device according to another embodiment of the present invention.

As shown in FIG. 4, in other embodiments, the display device 100 may further include a touch function layer 40', which may be an on cell structure, specifically formed between the OLED display layer 30 and the polarizer 50. The specific structure of the touch function layer 40' is not described herein for brevity, and can be referred to the prior art. The OLED display layer 30 can be covered with an encapsulation layer 40 for blocking moisture. The touch function layer 40' may be disposed between the encapsulation layer 40 and the polarizer 50.

Beneficial effects are that the transmittance of the display device can be improved by removing the polarizer in the area corresponding to the screen camera, and replacing the removed polarizer with a black ink that allows light of a specific wavelength to pass through, thereby enabling the camera to image in high definition, thus being conducive to the development of a full screen.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display device, comprising:
   a thin film transistor (TFT) array substrate;
   an organic light-emitting diode (OLED) display layer disposed on the TFT array substrate;
   a polarizer disposed on the OLED display layer, wherein the polarizer is provided with a through hole;
   a protective cover plate disposed on the polarizer; and
   a camera module disposed on a side of the TFT array substrate facing away from the OLED display layer, and disposed corresponding to the through hole in a thickness direction of the TFT array substrate; wherein
   an ink layer is disposed on a side of the protective cover plate adjacent to the OLED display layer; an orthographic projection of the ink layer on the TFT array substrate coincides with an orthographic projection of the through hole on the TFT array substrate; the ink layer transmits only red, green, and blue lights; the ink layer has a thickness of 10 micrometers to 100 micrometers; and the ink layer has a transmission width ranging from 3 to 50 nm for each of red, green and blue light wavelengths.

2. The display device according to claim 1, wherein the display device further comprises an adhesive layer attached to the protective cover plate and the polarizer.

3. The display device according to claim 2, wherein the ink layer is disposed on a side surface of the protective cover plate adjacent to the OLED display layer.

4. The display device according to claim 3, wherein the through hole is fully filled with the adhesive layer.

5. The display device according to claim 3, wherein the adhesive layer is provided between the ink layer and the polarizer.

6. The display device according to claim 4, wherein the adhesive layer has a thickness of 50 to 200 μm.

7. The display device according to claim 1, wherein an orthographic projection of the camera module on the TFT array substrate is within an orthographic projection of the ink layer on the TFT array substrate.

8. The display device according to claim 1, wherein the ink layer is a black ink layer.

9. A display device comprising:
   a thin film transistor (TFT) array substrate;
   an organic light-emitting diode (OLED) display layer disposed on the TFT array substrate;
   a polarizer disposed on the OLED display layer, wherein the polarizer is provided with a through hole;
   a protective cover plate disposed on the polarizer; and
   a camera module disposed on a side of the TFT array substrate facing away from the OLED display layer, and disposed corresponding to the through hole in a thickness direction of the TFT array substrate; wherein
   an ink layer is disposed on a side of the protective cover plate adjacent to the OLED display layer, an orthographic projection of the ink layer on the TFT array substrate coincides with an orthographic projection of the through hole on the TFT array substrate, and the ink layer transmits only red, green, and blue lights.

10. The display device according to claim 9, wherein the display device further comprises an adhesive layer attached to the protective cover plate and the polarizer.

11. The display device according to claim 9, wherein the ink layer is disposed on a side surface of the protective cover plate adjacent to the OLED display layer.

12. The display device according to claim 11, wherein the through hole is fully filled with the adhesive layer.

13. The display device according to claim 11, wherein the adhesive layer is disposed between the ink layer and the polarizer.

14. The display device according to claim 12, wherein the adhesive layer has a thickness of 50 to 200 μm.

15. The display device according to claim 9, wherein an orthographic projection of the camera module on the TFT array substrate is within an orthographic projection of the ink layer on the TFT array substrate.

16. The display device according to claim 9, wherein the ink layer has a thickness of 10 to 100 μm.

17. The display device according to claim 9, wherein the ink layer is a black ink layer.

18. The display device according to claim 17, wherein the ink layer has a transmission width ranging from 3 to 50 nm for each of red, green and blue light wavelengths.

* * * * *